United States Patent [19]

Melton

[11] Patent Number: 5,783,968
[45] Date of Patent: Jul. 21, 1998

[54] RF AMPLIFIER METHOD AND APPARATUS

[75] Inventor: John Russel Melton, Bolingbrook, Ill.

[73] Assignee: Motorola, Inc., Schaumburg, Ill.

[21] Appl. No.: 749,134

[22] Filed: Nov. 14, 1996

[51] Int. Cl.$^6$ .............................. H03F 1/34; H03G 3/20; H04B 1/04
[52] U.S. Cl. .............................. 330/107; 330/129; 455/126
[58] Field of Search .............................. 330/2, 107, 109, 330/129, 149; 455/126

[56] References Cited

U.S. PATENT DOCUMENTS

| | | | |
|---|---|---|---|
| 5,021,753 | 6/1991 | Chapman | 455/126 X |
| 5,066,923 | 11/1991 | Gailus | 330/107 |
| 5,134,718 | 7/1992 | Gailus | 455/102 |
| 5,175,879 | 12/1992 | Ellingson et al. | 455/126 |
| 5,469,105 | 11/1995 | Sparks | 330/129 |
| 5,574,992 | 11/1996 | Cygan et al. | 455/126 |

OTHER PUBLICATIONS

"Amplifier Linearisation Using RF Feedback and Feedforward Techniques," Michael Faulkner and Mark A. Briffa, IEEE, 1995.

*Primary Examiner*—Steven Mottola
*Attorney, Agent, or Firm*—Wayne J. Egan

[57] ABSTRACT

An RF power amplifier (100) includes a feedback loop with a loop phase, and is arranged for amplifying an RF signal (1). During an initial stabilizing mode (201), the amplifier is stabilized by applying a baseband reference signal (210) input via a reference input terminal to the feedback loop and adjusting the loop phase to an optimum value. Thereafter, during an amplifying mode (202), the RF signal is input via an RF input terminal and amplified while maintaining the loop phase at the optimum value. The feedback loop contains a baseband in-phase (I) path and a baseband quadrature (Q) path, and the baseband reference signal may be applied to the I path, the Q path, or both. The stabilizing and amplifying modes are fixed in duration and comprise a periodic cycle that is repeated. The input RF signal is substantially null during the stabilizing mode.

32 Claims, 2 Drawing Sheets

RF AMPLIFIER METHOD AND APPARATUS

INCORPORATION BY REFERENCE OF OTHER U.S. PATENTS

The applicant hereby incorporates by reference U.S. Pat. No. 5,066,923, Paul H. Gailus et al., "Linear transmitter training method and apparatus," issued Nov. 19, 1991, hereinafter referred to as "Gailus et al. '923", verbatim and with the same effect as though the same patent were fully and completely set forth herein. The applicant hereby incorporates by reference U.S. Pat. No. 5,134,718, Paul H. Gailus, "Fast phase shift adjusting method and device for linear transmitter," issued Jul. 28, 1992, hereinafter referred to as "Gailus '718", verbatim and with the same effect as though the same patent were fully and completely set forth herein.

FIELD OF THE INVENTION

This application relates to amplifiers including, but not limited to, an RF amplifier method and apparatus.

BACKGROUND OF THE INVENTION

Radio frequency ("RF") amplifiers with feedback loops are known.

One example of such a prior art RF amplifier is the foregoing Gailus et al. '923 patent, "Linear Transmitter Training Method and Apparatus." Further, as known, "close-in" noise performance is defined as the ratio of the desired RF signal power to the undesired noise power at frequency offsets from 50K Hertz ("Hz") to 500K Hz either above or below the desired signal. Moreover, it has been determined that the prior art "close-in" noise performance must be improved somewhat in order to be compatible with certain European regulatory emission requirements, particularly the ETSI 300-394-1 standard for the Trans European Trunked Radio system.

Therefore, there is a need for an improved RF amplifier.

DESCRIPTION OF THE PREFERRED EMBODIMENT

Briefly, an RF power amplifier includes a feedback loop with a loop phase, and is arranged for amplifying an RF signal. During an initial stabilizing mode, the amplifier is stabilized by applying a baseband reference signal input via a reference input terminal to the feedback loop and adjusting the loop phase to an optimum value. Thereafter, during an amplifying mode, the RF signal is input via an RF input terminal and amplified while maintaining the loop phase at the optimum value. The feedback loop contains a baseband in-phase (I) path and a baseband quadrature (Q) path, and the baseband reference signal may be applied to the I path, the Q path, or both. The stabilizing and amplifying modes are fixed in duration and comprise a periodic cycle that is repeated. The input RF signal is substantially null during the stabilizing mode.

Figure 1:
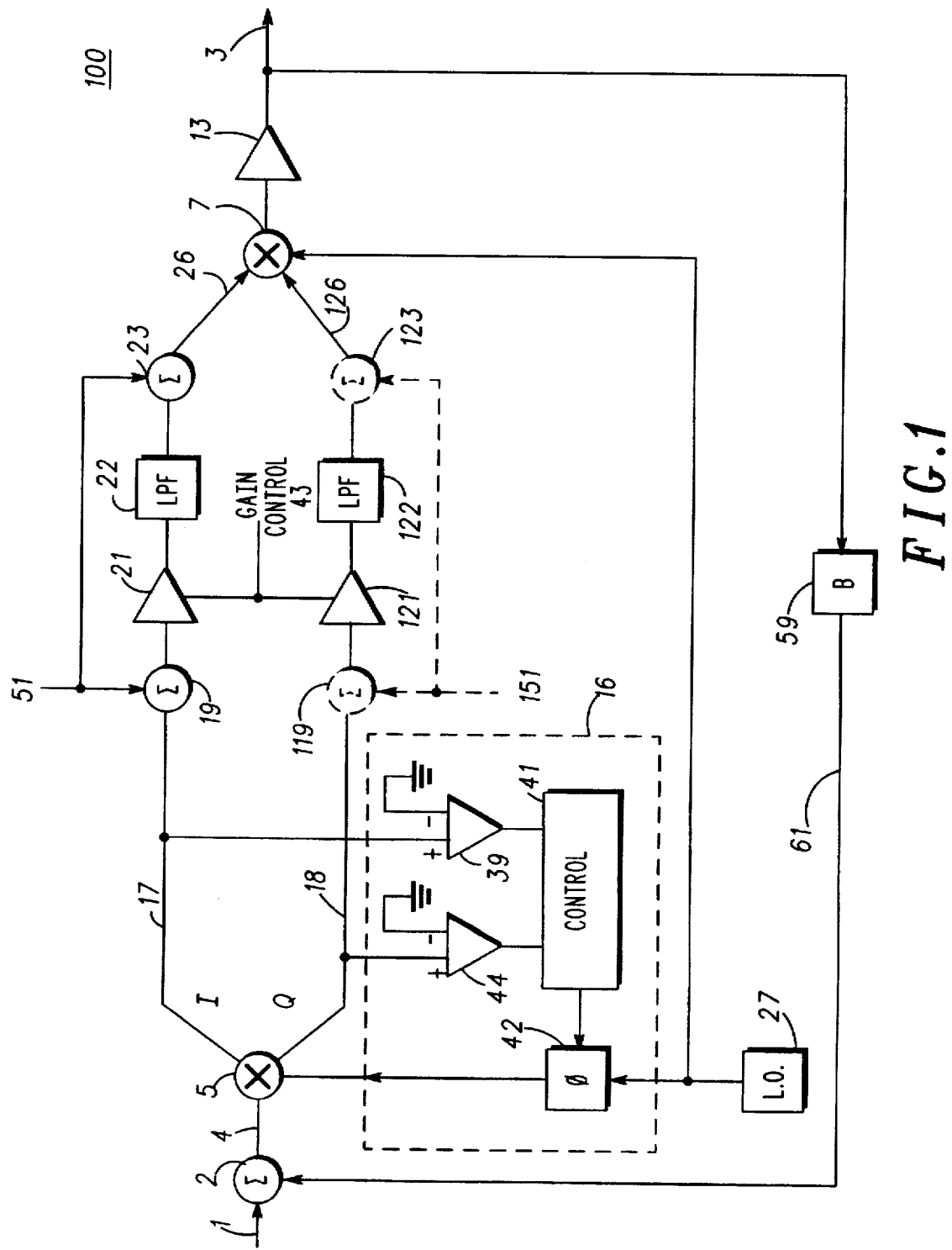
FIG. 1 depicts an RF amplifier apparatus 100 in accordance with the present invention.

Referring now to FIG. 1, there is shown an RF amplifier apparatus 100 including a feedback loop. As will be explained in greater detail below, the RF amplifier 100 is arranged for amplifying an RF signal of a fixed RF frequency modulated with user information. Also, the amplifier 100 includes an RF input terminal 1 and a reference input terminal 51.

As shown, the RF signal input at terminal 1 is passed to a first summing amplifier 2. Under control of a local oscillator 27 and a phase shift unit 42, a first mixer 5 then down-converts the summing result 4 to a baseband leg comprising a baseband in-phase (I) path 17 and a baseband quadrature (Q) path 18.

As shown, the baseband I-path 17 includes a second summing amplifier 19, a first variable gain baseband amplifier 21, a first low-pass filter 22, and a third summing amplifier 23. Also as shown, the baseband Q-path 18 includes a second variable gain baseband amplifier 121, and a second low-pass filter 122.

Under control of the local oscillator 27, a second mixer 7 then up-converts the baseband I-path result 26 and the baseband Q-path result 126 to form an input to an amplifier 13 which, in turn, forms an RF output 3. As shown, a portion of the output 3 (represented in FIG. 1 by the scaling factor B, element 59) is fed-back to the first summing amplifier 2 via the path 61.

As will be described in greater detail below, the amplifier 100's feedback loop contains a loop phase that is to be adjusted for optimum performance. Moreover, in accordance with the present invention, the amplifier 100 is arranged for amplifying the RF signal 1 using a two-step process, as discussed below.

First, during an initial stabilizing mode (depicted as element 201 in FIG. 2), the RF amplifier is stabilized by applying a baseband reference signal (depicted as element 210 in FIG. 2) to the feedback loop and adjusting the loop phase to an optimum value. The optimum value is 180 degrees at the fixed RF frequency of the input RF signal 1. Note the baseband reference signal 210 is applied to the amplifier 100 at the reference input terminal 51.

Figure 2:
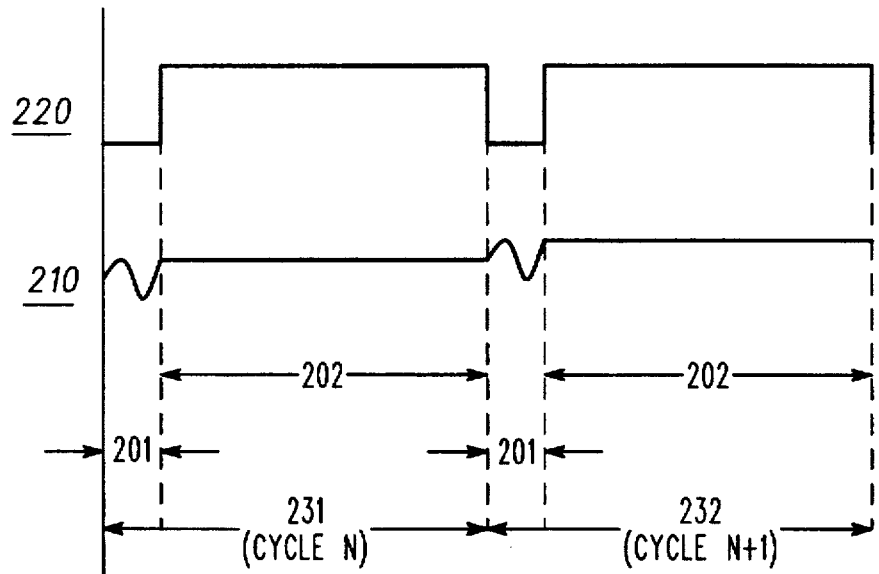
FIG. 2 depicts signal waveforms for FIG. 1.

Second, subsequent to the stabilizing mode, the amplifier amplifies the RF signal (depicted as element 220 in FIG. 2) during an amplifying mode (depicted as element 202 in FIG. 2). During the amplifying mode, this amplifying step includes a step of maintaining the loop phase at the optimum value. Note the input RF signal 220 is applied to the amplifier 100 at the RF input terminal 1.

Referring now to FIG. 2, the above two-step process may be understood with reference to the two signal waveforms 210 and 220 for the amplifier 100. In FIG. 2, the baseband reference signal is depicted as waveform 210 and the input RF signal is depicted as element 220. As shown, during the initial stabilizing mode 201, the baseband reference signal 210 comprises a sine wave and the input RF signal 220 is substantially null. Thereafter, during the following amplifying mode 202, the baseband reference signal 210 is substantially null and the RF signal 220 comprises a fixed RF frequency that is modulated with user data. As shown, the stabilizing mode 201 and amplifying mode 202 are each fixed in duration and comprise a periodic cycle 231 that is repeated. Although FIG. 2 depicts only two such cycles, namely, an arbitrary cycle N (element 231) and the subsequent cycle N+1 (element 232), it will be understood that the cycles are continuous.

In one embodiment, the stabilizing mode 201 is about 230 microseconds in duration, the amplifying mode 202 is about 15-18 minutes in duration, the fixed RF frequency is about 400 MHz, the baseband reference signal sine wave has a frequency of about 4,200 Hz with an amplitude of about 1 volt peak and a phase of about zero.

Returning to FIG. 1, it will be appreciated that the feedback loop includes a baseband leg generally comprising the baseband I path 17 and the baseband Q path 18. As mentioned above, the above stabilizing step includes a step of loop-phase adjusting, including applying the baseband reference signal 210 to the baseband leg via the reference input terminal 51.

The present loop-phase-adjusting step is that of the foregoing Gailus et al. '923 patent, "Linear transmitter training method and apparatus." See, Gailus et al. '923, especially column 3, lines 14-33. Briefly, in an open loop mode, the variable gain baseband amplifiers 21 and 121 are disabled via a gain control signal 43, thereby open-circuiting this portion of the I-path 17 and the Q-path 18.

In a first embodiment, the loop-phase adjusting includes a step of applying the baseband reference signal to the baseband I path 17. In FIG. 1, this is depicted as the baseband reference signal 210 being applied via the reference input terminal 51 to the summing amplifiers 19 and 23. In this mode, the loop phase shift is adjusted by the phase shift adjustment unit 16. In effect, phase differences are determined by the comparators 39 and 44, and that difference information is utilized by the control unit 41 to adjust the phase shift via the phase shift unit 42.

Additional information regarding this process may be found in the foregoing Gailus '718 patent, "Fast phase shift adjusting method and device for linear transmitter." Moreover, FIG. 1 circuit elements 16, 21, 22, 39, 41, 42, 43 and 44 respectively correspond to the like-numbered elements in Gailus et al. '923.

In a second embodiment, the loop-phase adjusting includes a step of applying the baseband reference signal to the baseband 0 path 18 which, in this embodiment, includes a fourth summing amplifier 119 and a fifth summing amplifier 123, as shown in broken lines. In FIG. 1, this is depicted (in broken lines) as the baseband reference signal 210 being applied via a reference input terminal 151 to the summing amplifiers 119 and 123. The remainder of the loop-phase adjusting is the same as described above for the first embodiment.

In a third embodiment, the loop-phase adjusting includes a step of applying the baseband reference signal 210 to the baseband I path 17 and in quadrature to the baseband Q path 18. In FIG. 1, this is depicted as the baseband reference signal 210 being applied via the reference input terminal 51 to the summing amplifiers 19 and 23 and in quadrature via the reference input terminal 151 to the summing amplifiers 119 and 123. The remainder of the loop-phase adjusting is the same as described above for the first embodiment.

In one embodiment, the RF amplifier 100 comprises an RF power amplifier.

Figure 3:
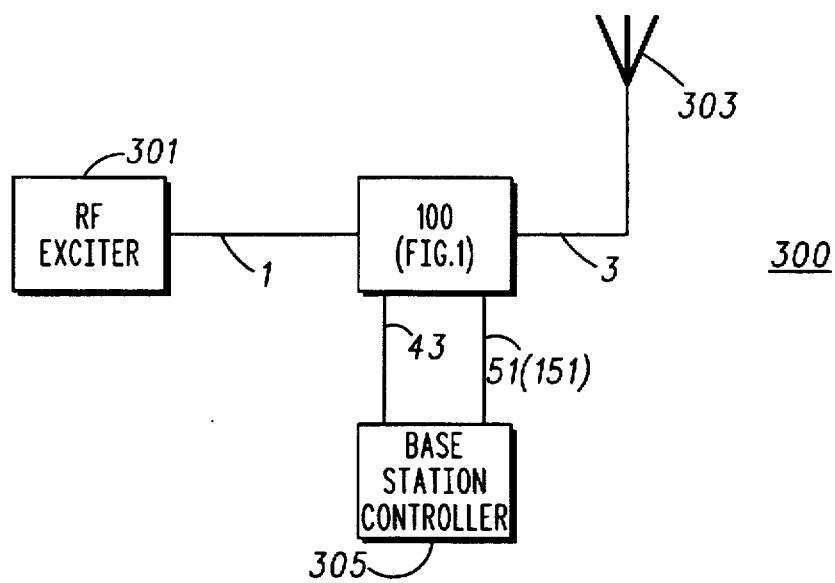
FIG. 3 depicts an RF base station equipped with the RF amplifier apparatus 100 of FIG. 1.

FIG. 3 depicts an RF base station equipped with the RF amplifier apparatus 100 of FIG. 1. As shown, the RF input signal is coupled via the terminal 1 to an RF exciter 301. Also, the RF output signal 3 is coupled via the terminal 3 to an antenna 303. Also, the gain control signal is coupled to a base station controller unit 305 via the terminal 43. Also, the baseband reference signal is coupled to the base station controller unit 305 via the reference input terminal 51 (or 151, or both, depending on whether the above first, second or third embodiment is used).

Still referring to FIG. 3, it will be recalled that the RF signal 220 is substantially null during the stabilizing mode 201. In one embodiment, this null condition may be achieved by equipping the RF exciter 301 with a relay and arranging the relay to open-circuit the RF input terminal 1 during the stabilizing mode.

In summary, generally referring to FIGS. 1-2, there has been shown, in an RF amplifier 100 including a feedback loop with a loop phase, a method of amplifying an RF signal 1, comprising the steps of:

(a) stabilizing the RF amplifier during a stabilizing mode 201 by applying a baseband reference signal 210 to the feedback loop and adjusting the loop phase to an optimum value; and, (b) subsequent to the stabilizing mode, amplifying the RF signal during an amplifying mode 202.

Further, the stabilizing mode and amplifying mode are each fixed in duration and comprise a periodic cycle 231 that is repeated.

Also, the amplifying step (b) includes a step of maintaining the loop phase at the optimum value during the amplifying mode.

Further, the feedback loop includes a baseband leg, and the stabilizing step (a) includes a step of applying the baseband reference signal to the baseband leg.

Also, the baseband leg comprises a baseband in-phase path 17 and a baseband quadrature path 18.

Further, in a first embodiment, the stabilizing step (a) includes a step of applying the baseband reference signal to the baseband inphase path via the reference input terminal 51. Also, in a second embodiment, the stabilizing step (a) includes a step of applying the baseband reference signal to the baseband quadrature path via the reference input terminal 151. Further, in a third embodiment, the stabilizing step (a) includes a step of applying the baseband reference signal to the baseband in-phase path and in quadrature to the baseband quadrature path via the reference input terminals 51 and 151.

Moreover, the RF signal includes a fixed RF frequency, and the optimum value is 180 degrees at the fixed RF frequency.

Further, the RF signal is substantially null during the stabilizing mode.

Also, in the first and second embodiments, the RF amplifier 100 includes a single reference input terminal 51 or 151, and an RF input terminal 1 and the stabilizing step (a) includes a step of applying the baseband reference signal 210 to the single reference input terminal 51 or 151, and the amplifying step (b) includes a step of applying the RF signal to the RF input terminal 1. Further, in the third embodiment, the RF amplifier 100 includes two reference input terminals 51 and 151, and an RF input terminal 1, and the stabilizing step (a) includes a step of applying the baseband reference signal 210 to the reference input terminal 51 and in quadrature to the reference input terminal 151, and the amplifying step (b) includes a step of applying the RF signal to the RF input terminal 1.

Still generally referring to FIGS. 1-2, there has been shown an RF amplifier 100 including a stabilizing mode 201 and an amplifying mode 202, the RF amplifier including an RF input terminal 1, a feedback loop including a baseband leg, the baseband leg including a reference input terminal 51 or 151, the RF input terminal operably coupled to an RF signal to be amplified during the amplifying mode, and the reference input terminal operably coupled to a baseband reference signal to be used for stabilizing the RF amplifier during the stabilizing mode.

Moreover, it will be appreciated that, in the stabilizing mode 201, the feedback summing junction is the I-path 17 second summing amplifier 19 in the first embodiment, or the Q-path 18 fourth summing amplifier 119 in the second embodiment, or both the I-path 17 second summing amplifier 19 and the Q-path 18 fourth summing amplifier 119 in the third embodiment. Accordingly, the RF amplifier 100 feedback loop comprises a Cartesian feedback loop in the stabilizing mode 201. In contrast, in the amplifying mode 202, the feedback summing junction is the RF input path 1 first summing amplifier 2. Therefore, the RF amplifier 100 feedback loop comprises an RF feedback loop in the amplifying mode 202.

The following are some advantages of an RF amplifier method and apparatus, in accordance with the present invention, as compared to the prior art:

The present invention results in superior close-in noise performance within the unity gain bandwidth of the feedback loop.

Typical unity gain bandwidths range from 100 kHz to 1 MHz depending on the desired channel bandwidth. The present invention is capable of as much as 15 dB improved close-in noise performance over approximately 80% of the unity gain bandwidth and is accomplished on both sides of the RF signal. Close-in noise within the unity gain bandwidth is substantially improved by moving the automatic loop stabilizing circuitry into the forward path of the feedback loop where its close-in noise contribution is suppressed by the loop gain of the system.

The present invention retains the automatic stabilizing feature of the prior art by providing for the baseband input for stabilizing purposes and using that only during the stabilizing cycle and then switching to the RF input port during the user cycle. Improvement of close-in noise within a few hundred kHz of the RF signal is important because it cannot be easily and inexpensively filtered.

Moreover, while both the prior art and the present invention allow output power to be adjusted by adjusting the input signal level (baseband for the prior art and the RF input level for the present invention), the present invention maintains the superior close-in noise performance over at least 10 dB of input level. In contrast, the prior art close-in noise performance is optimum at the maximum input power level and degrades as the input signal is reduced.

Other benefits of the present invention are discussed below:

The resulting RF amplifier is much lower cost by as much as 70% versus alternative feed-forward amplifier technologies.

This RF system is smaller in size and weight by as much as 50% versus alternative technologies such as feed-forward.

This RF system has the automatic loop stabilization feature that eliminates factory manual loop adjustments and provides for automatic loop adjustments that may be required due to environmental changes that commonly occur while such a system is in service.

This RF system is frequency agile and does not require manual alignment or adjustments when the carrier frequency is changed within the bandwidth of a particular implementation.

While various embodiments of an RF amplifier method and apparatus, in accordance with the present invention, have been described hereinabove, the scope of the invention is defined by the following claims.

I claim:

1. In an RF amplifier including a baseband reference signal input terminal and an RF signal input terminal and including a feedback loop with a loop phase, a method of amplifying an RF signal, comprising the steps of:

(a) stabilizing the RF amplifier during a stabilizing mode by applying a baseband reference signal to the feedback loop and adjusting the loop phase to an optimum value, the baseband reference signal being applied by means of the baseband reference signal input terminal; and, (b) subsequent to the stabilizing mode, applying the RF signal and amplifying the RF signal during an amplifying mode, the RF signal being applied by means of the RF signal input terminal.

2. The method of claim 1, where the stabilizing mode and the amplifying mode are each fixed in duration and comprise a periodic cycle that is repeated.

3. The method of claim 1, where the amplifying step (b) includes a step of maintaining the loop phase at the optimum value during the amplifying mode.

4. The method of claim 1, where the feedback loop includes a baseband leg, and the stabilizing step (a) includes a step of applying the baseband reference signal to the baseband leg.

5. The method of claim 4, where the baseband leg comprises a baseband in-phase path and a baseband quadrature path and the stabilizing step (a) includes a step of applying the baseband reference signal to the baseband in-phase path.

6. The method of claim 4, where the baseband leg comprises a baseband in-phase path and a baseband quadrature path and the stabilizing step (a) includes a step of applying the baseband reference signal to the baseband quadrature path.

7. The method of claim 4, where the baseband leg comprises a baseband in-phase path and a baseband quadrature path and the stabilizing step (a) includes a step of applying the baseband reference signal to the baseband in-phase path and in quadrature to the baseband quadrature path.

8. In an RF amplifier including a feedback loop with a loop phase, a method of amplifying an RF signal, comprising the steps of:

(a) stabilizing the RF amplifier during a stabilizing mode by applying a baseband reference signal to the feedback loop and adjusting the loop phase to an optimum value; and (b) subsequent to the stabilizing mode, amplifying the RF signal during an amplifying mode, where the feedback loop includes a baseband leg, and the stabilizing step (a) includes a step of applying the baseband reference signal to the baseband leg, and where the RF signal includes a fixed RF frequency, and the optimum value is 180 degrees at the fixed RF frequency.

9. In an RF amplifier including a feedback loop with a loop phase, a method of amplifying an RF signal, comprising the steps of:

(a) stabilizing the RF amplifier during a stabilizing mode by applying a baseband reference signal to the feedback loop and adjusting the loop phase to an optimum value; and (b) subsequent to the stabilizing mode, amplifying the RF signal during an amplifying mode, where the RF signal is substantially null during the stabilizing mode.

10. In an RF amplifier including a feedback loop with a loop phase, a method of amplifying an RF signal, comprising the steps of:

(a) stabilizing the RF amplifier during a stabilizing mode by applying a baseband reference signal to the feedback loop and adjusting the loop phase to an optimum value; and (b) subsequent to the stabilizing mode, amplifying the RF signal during an amplifying mode, where the RF amplifier includes a reference input terminal and an RF input terminal and the stabilizing step (a) includes a step of applying the baseband reference signal to the reference input terminal and the amplifying step (b) includes a step of applying the RF signal to the RF input terminal.

11. An RF amplifier including a baseband reference signal input terminal and an RF signal input terminal and including a feedback loop with a loop phase and arranged for amplifying an RF signal, the RF amplifier comprising:

stabilizing means for stabilizing the RF amplifier during a stabilizing mode by applying a baseband reference signal to the feedback loop and adjusting the loop phase to an optimum value, the baseband reference signal input terminal arranged for applying the baseband reference signal; and, amplifying means for, subsequent to the stabilizing mode, amplifying the RF signal during an amplifying mode, the RF signal input terminal arranged for applying the RF signal.

12. The RF amplifier of claim 11, where the stabilizing mode and the amplifying mode are each fixed in duration and comprise a periodic cycle that is repeated.

13. The RF amplifier of claim 11, where the amplifying means includes means for maintaining the loop phase at the optimum value during the amplifying mode.

14. The RF amplifier of claim 11, where the feedback loop includes a baseband leg, and the stabilizing means includes means for applying the baseband reference signal to the baseband leg.

15. The RF amplifier of claim 14, where the baseband leg comprises a baseband in-phase path and a baseband quadrature path and the stabilizing means includes means for applying the baseband reference signal to the baseband in-phase path.

16. The RF amplifier of claim 14, where the baseband leg comprises a baseband in-phase path and a baseband quadrature path and the stabilizing means includes means for applying the baseband reference signal to the baseband quadrature path.

17. The RF amplifier of claim 14, where the baseband leg comprises a baseband in-phase path and a baseband quadrature path and the stabilizing means includes means for applying the baseband reference signal to the baseband in-phase path and in quadrature to the baseband quadrature path.

18. An RF amplifier including a feedback loop with a loop phase and arranged for amplifying an RF signal, the RF amplifier comprising:

stabilizing means for stabilizing the RF amplifier during a stabilizing mode by applying a baseband reference signal to the feedback loop and adjusting the loop phase to an optimum value; and amplifying means for, subsequent to the stabilizing mode, amplifying the RF signal during an amplifying mode, where the feedback loop includes a baseband leg, and the stabilizing means includes means for applying the baseband reference signal to the baseband leg, and where the RF signal includes a fixed RF frequency, and the optimum value is 180 degrees at the fixed RF frequency.

19. An RF amplifier including a feedback loop with a loop phase and arranged for amplifying an RF signal, the RF amplifier comprising:

stabilizing means for stabilizing the RF amplifier during a stabilizing mode by applying a baseband reference signal to the feedback loop and adjusting the loop phase to an optimum value; and amplifying means for, subsequent to the stabilizing mode, amplifying the RF signal during an amplifying mode, where the RF signal is substantially null during the stabilizing mode.

20. The RF amplifier of claim 11, where the RF amplifier comprises an RF power amplifier.

21. An RF amplifier including a feedback loop with a loop phase and arranged for amplifying an RF signal, the RF amplifier comprising:

stabilizing means for stabilizing the RF amplifier during a stabilizing mode by applying a baseband reference signal to the feedback loop and adjusting the loop phase to an optimum value; and amplifying means for, subsequent to the stabilizing mode, amplifying the RF signal during an amplifying mode, including a reference input terminal for applying the baseband reference signal to the stabilizing means and an RF input terminal for applying the RF signal to the amplifying means.

22. A base station including an RF power amplifier, the RF power amplifier including a baseband reference signal input terminal and an RF signal input terminal and including a feedback loop with a loop phase and arranged for amplifying an RF signal, the RF power amplifier comprising:

stabilizing means for stabilizing the RF power amplifier during a stabilizing mode by applying a baseband reference signal to the feedback loop and adjusting the loop phase to an optimum value, the baseband reference signal input terminal arranged for applying the baseband reference signal; and, amplifying means for, subsequent to the stabilizing mode, amplifying the RF signal during an amplifying mode, the RF signal input terminal arranged for applying the RF signal.

23. The base station of claim 22, where the stabilizing mode and the amplifying mode are each fixed in duration and comprise a periodic cycle that is repeated.

24. The base station of claim 22, where the amplifying means includes means for maintaining the loop phase at the optimum value during the amplifying mode.

25. The base station of claim 22, where the feedback loop includes a baseband leg, and the stabilizing means includes means for applying the baseband reference signal to the baseband leg.

26. The base station of claim 25, where the baseband leg comprises a baseband in-phase path and a baseband quadrature path and the stabilizing means includes means for applying the baseband reference signal to the baseband in-phase path.

27. The base station of claim 25, where the baseband leg comprises a baseband in-phase path and a baseband quadrature path and the stabilizing means includes means for applying the baseband reference signal to the baseband quadrature path.

28. A base station including an RF power amplifier, the RF power amplifier including a feedback loop with a loop phase and arranged for amplifying an RF signal, the RF power amplifier comprising:

stabilizing means for stabilizing the RF power amplifier during a stabilizing mode by applying a baseband reference signal to the feedback loop and adjusting the loop phase to an optimum value; and amplifying means for, subsequent to the stabilizing mode, amplifying the RF signal during an amplifying mode, where the feedback loop includes a baseband leg, and the stabilizing means includes means for applying the baseband reference signal to the baseband leg, and where the RF signal includes a fixed RF frequency, and the optimum value is 180 degrees at the fixed RF frequency.

29. A base station including an RF power amplifier, the RF power amplifier including a feedback loop with a loop phase and arranged for amplifying an RF signal, the RF power amplifier comprising:

stabilizing means for stabilizing the RF power amplifier during a stabilizing mode by applying a baseband reference signal to the feedback loop and adjusting the loop phase to an optimum value; and amplifying means for, subsequent to the stabilizing mode, amplifying the RF signal during an amplifying mode, where the RF signal is substantially null during the stabilizing mode.

30. An RF amplifier including a stabilizing mode and an amplifying mode, the RF amplifier including an RF input terminal, a feedback loop including a baseband leg, the baseband leg including a reference input terminal, the RF input terminal arranged for applying an RF signal to be amplified during the amplifying mode, and the reference input terminal arranged for applying a baseband reference signal to be used for stabilizing the RF amplifier during the stabilizing mode.

31. The RF amplifier of claim 30, where the stabilizing mode and the amplifying mode are each fixed in duration and comprise a periodic cycle that is repeated.

32. An RF amplifier including a stabilizing mode and an amplifying mode, the RF amplifier including an RF input terminal, a feedback loop including a baseband leg, the baseband leg including a reference input terminal, the RF input terminal operably coupled to an RF signal to be amplified during the amplifying mode, and the reference input terminal operably coupled to a baseband reference signal to be used for stabilizing the RF amplifier during the stabilizing mode, where the stabilizing mode and the amplifying mode are each fixed in duration and comprise a periodic cycle that is repeated, and where the RF signal is substantially null during the stabilizing mode.

* * * * *